(12) United States Patent
Lu et al.

(10) Patent No.: US 9,496,417 B2
(45) Date of Patent: Nov. 15, 2016

(54) NON-VOLATILE MEMORY CELL

(71) Applicant: AMIC Technology Corporation, Hsin-Chu (TW)

(72) Inventors: Hsiao-Hua Lu, Hsinchu County (TW); Chih-Ming Kuo, Hsinchu (TW); Chih-Lung Chang, Hsinchu (TW)

(73) Assignee: AMIC Technology Corporation, Hsin-Chu (TW)

( * ) Notice: Subject to any disclaimer, the term of this patent is extended or adjusted under 35 U.S.C. 154(b) by 0 days.

(21) Appl. No.: 14/644,217

(22) Filed: Mar. 11, 2015

(65) Prior Publication Data

US 2016/0211029 A1 Jul. 21, 2016

(30) Foreign Application Priority Data

Jan. 15, 2015 (TW) .............................. 104101366 A

(51) Int. Cl.
*H01L 27/115* (2006.01)
*G11C 16/14* (2006.01)
*H01L 29/788* (2006.01)
*G11C 16/02* (2006.01)

(52) U.S. Cl.
CPC ........... *H01L 29/7883* (2013.01); *G11C 16/02* (2013.01); *H01L 27/1157* (2013.01); *H01L 27/11524* (2013.01); *H01L 27/11529* (2013.01); *H01L 27/11573* (2013.01)

(58) Field of Classification Search
CPC ... G11C 16/0441; G11C 16/14; G11C 16/26; H01L 27/11519; H01L 27/11558
See application file for complete search history.

(56) References Cited

U.S. PATENT DOCUMENTS

| | | | | |
|---|---|---|---|---|
| 5,904,524 A * | 5/1999 | Smolen | ................. | H01L 27/115 257/E21.422 |
| 6,466,482 B2 * | 10/2002 | Shukuri | ............. | G11C 16/0441 365/185.01 |
| 8,472,251 B2 | 6/2013 | Lee | | |
| 9,041,089 B2 * | 5/2015 | Chen | ................. | H01L 27/11524 257/315 |
| 9,368,161 B2 * | 6/2016 | Tsao | ......................... | G11C 5/06 |
| 2007/0120172 A1 | 5/2007 | Hsu | | |

FOREIGN PATENT DOCUMENTS

TW 201212032 A1 3/2012

* cited by examiner

*Primary Examiner* — Allison P Bernstein
(74) *Attorney, Agent, or Firm* — Winston Hsu; Scott Margo

(57) ABSTRACT

A non-volatile memory cell includes a tunneling part; a coupling device; a read transistor; a first select transistor connected to the read transistor forming a read path with the read transistor in a read mode; an erase tunneling structure forming a tunneling ejection path in an erase mode; and a program tunneling structure forming a tunneling injection path in an program mode; wherein the read path is different from the tunneling ejection path and the tunneling injection path.

17 Claims, 12 Drawing Sheets

NON-VOLATILE MEMORY CELL

BACKGROUND OF THE INVENTION

1. Field of the Invention

The present invention relates to a non-volatile memory cell, and more particularly, to a non-volatile memory cell with enhanced endurance.

2. Description of the Prior Art

Non-volatile memory is a kind of memory which is capable of storing data without power supply. Common non-volatile memories include magnetic memory devices, CD-ROM, flash memory, etc. In general, the non-volatile memory is fabricated by a logic based complementary metal oxide semiconductor (CMOS) process. Each non-volatile memory cell of the non-volatile memory may operate in a read mode, a program mode and an erase mode.

The non-volatile memory cells in the prior art suffer from the poor endurance. Specifically, when the non-volatile memory cell operates in a program/erase mode, a tunneling effect is produced on a floating gate of the non-volatile memory cell by apply proper bias voltages to perform a program/erase operation. After the program/erase operation of the non-volatile memory cells in the prior art is performed many times, a threshold voltage of a transistor of the non-volatile memory cell raises due to the tunneling effect, and the transistor of the non-volatile memory cell degrades, such that the read performance of the non-volatile memory cell is reduced.

For example, FIG. 1A is a top view of a circuit layout of a non-volatile memory cell 10 according to U.S. Pat. No. 8,625,350, and FIG. 1B is a schematic circuit diagram of the non-volatile memory cell 10. The non-volatile memory cell 10 comprises a coupling device 100, a read transistor 110, an erase transistor 120, a word transistor 130 and a bit transistor 140. When the non-volatile memory cell 10 operates in an erase mode, the erase transistor 120 generates the tunneling effect, and the electrons are ejected from a floating gate FG1 of the read transistor 110. When the non-volatile memory cell 10 operates in a program mode, the read transistor 110 generates the tunneling effect to inject the electrons to the floating gate FG1. When the non-volatile memory cell 10 operates in a read mode, a logic status of the non-volatile memory cell 10 is determined according to a read current IR1 flowing through the read transistor 110. Notably, the electrons are injected into the floating gate FG1 in the program mode, causing the charge trapping effect in the read transistor 110. After the program operation is performed many times, the read transistor 110 is gradually degraded, i.e., the threshold voltage of the read transistor 110 is gradually increased. Thus, determination of the read current IR1 of the non-volatile memory cell 10 in the read mode would be affected, and the read performance of the non-volatile memory cell 10 is reduced.

In another perspective, FIG. 2A is a top view of a circuit layout of a non-volatile memory cell 20 according to U.S. Pat. No. 7,326,994, and FIG. 2B is a schematic circuit diagram of the non-volatile memory cell 20. The non-volatile memory cell 20 comprises a coupling device 200, a read transistor 210, a select transistor 230 and an erase transistor 220. When the non-volatile memory cell 20 needs to eject the electrons from a floating gate FG2, the tunneling effect is produced on the erase transistor 220, and the electrons are ejected from the floating gate FG2. When the non-volatile memory cell 20 needs to inject the electrons into the floating gate FG2, the tunneling injection is produced on the read transistor 210 to inject the electrons into the floating gate FG2. When the non-volatile memory cell 20 operates in the read mode, a logic status of the non-volatile memory cell 20 is determined according to a read current IR2 flowing through the read transistor 210. Similarly, the electrons are injected into the floating gate FG2, causing the charge trapping effect in the read transistor 210. After the tunneling injection is performed many times, the read transistor 210 is gradually degraded, i.e., the threshold voltage of the read transistor 210 is gradually increased. Thus, determination of the read current I21 of the non-volatile memory cell 20 in the read mode would be affected, and the read performance of the non-volatile memory cell 20 is reduced.

Therefore, how to avoid the read performance of the non-volatile memory cell being affected by the degradation of the transistor and enhance the endurance of the non-volatile memory cell is a significant objective in the field.

SUMMARY OF THE INVENTION

It is therefore a primary objective of the present invention to provide a non-volatile memory cell, to improve over disadvantages of the prior art.

The invention discloses a non-volatile memory cell, comprising a tunneling part; a coupling device comprising a coupling part and a conductive region, the coupling part coupled to the tunneling part and disposed on the conductive region; a read transistor comprising a read gate coupled to the tunneling part; a first select transistor, connected to the read transistor in series, configured for forming a read path with the read transistor when the non-volatile memory cell operates in a read mode; an erase tunneling structure configured for forming a tunneling ejection path when the non-volatile memory cell operates in an erase mode, the erase tunneling structure comprising an erase active region disposed under a first edge of the tunneling part and partially overlapping with a projection result of the tunneling part; and a program tunneling structure forming a tunneling injection path when the non-volatile memory cell operates in a program mode, the program tunneling structure comprising a program active region disposed under a second edge of the tunneling part and partially overlapping with the projection result of the tunneling part; wherein the read path is different from the tunneling ejection path and the tunneling injection path.

These and other objectives of the present invention will no doubt become obvious to those of ordinary skill in the art after reading the following detailed description of the preferred embodiment that is illustrated in the various figures and drawings.

DETAILED DESCRIPTION

The non-volatile memory cell in the present invention is fabricated by a logic-based complementary metal oxide semiconductor (CMOS) process. The logic-based CMOS process is known in the art. In short, in a fabrication perspective, the logic-based CMOS process implants an active region in an electron well, and forms an insulation layer and a conductive layer in the electron well above the active region. In a circuit layout perspective, the active region is under the insulation layer and the conductive layer, and the electron well is disposed under the active region. Therefore, in the following description and in the claims, "over" and "under" represent relative positions of different layers in circuit layout. For example, "the electron well is disposed under the active region" represents the active region is implanted in the electron well, and "the insulation layer and the conductive layer is disposed over the active region" or "the active region is disposed under the insulation layer and the conductive layer" represent that the insulation layer and the conductive layer are formed in the electron well above the active region.

Figure 1A:
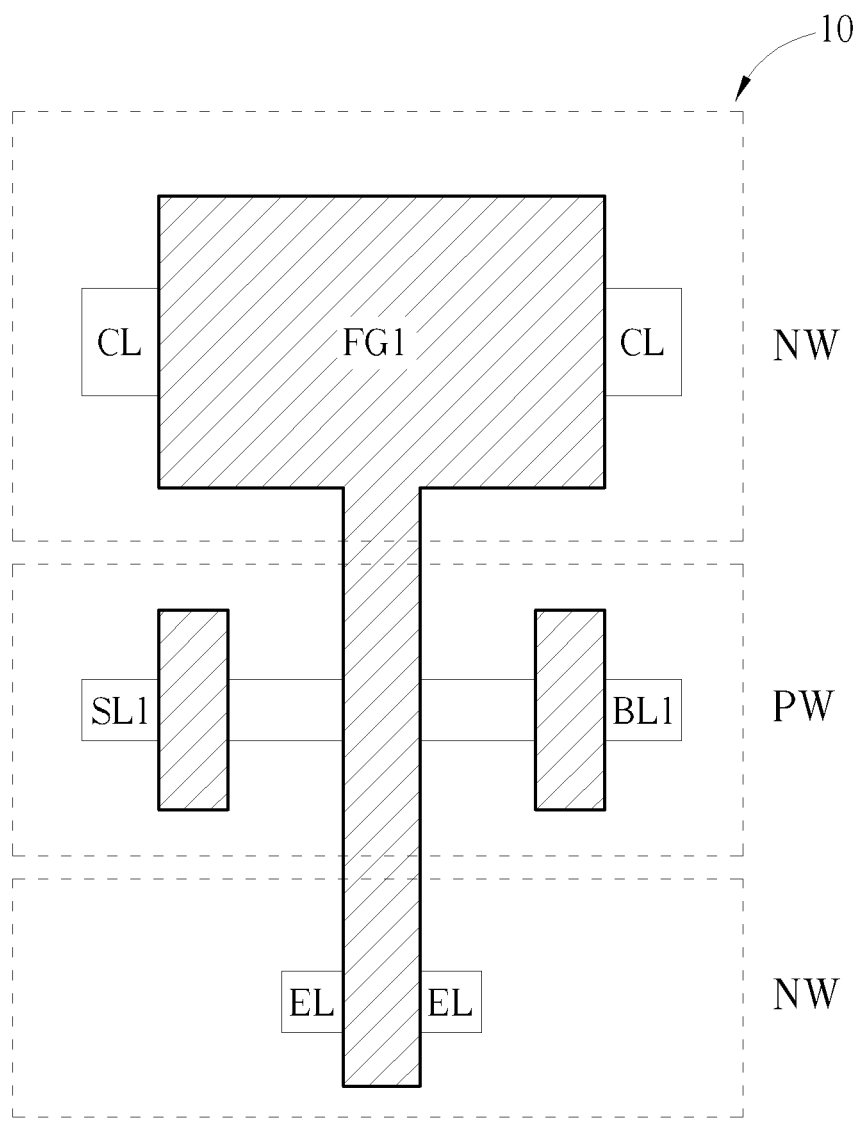
FIG. 1A is a top view of a circuit layout of a non-volatile memory cell according to the prior art.
Figure 1B:
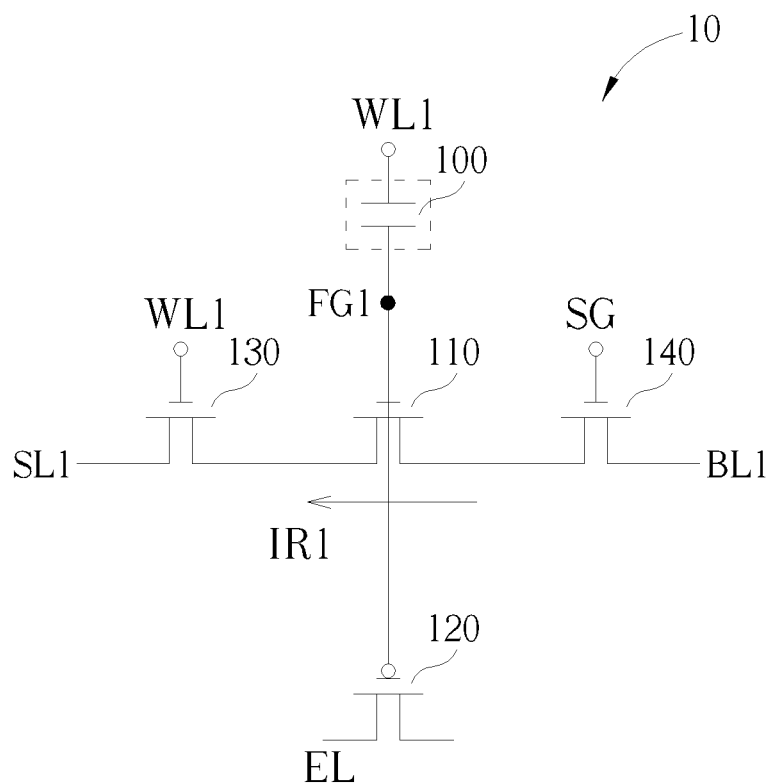
FIG. 1B is a schematic circuit diagram of the non-volatile memory cell shown in FIG. 1A.
Figure 2A:
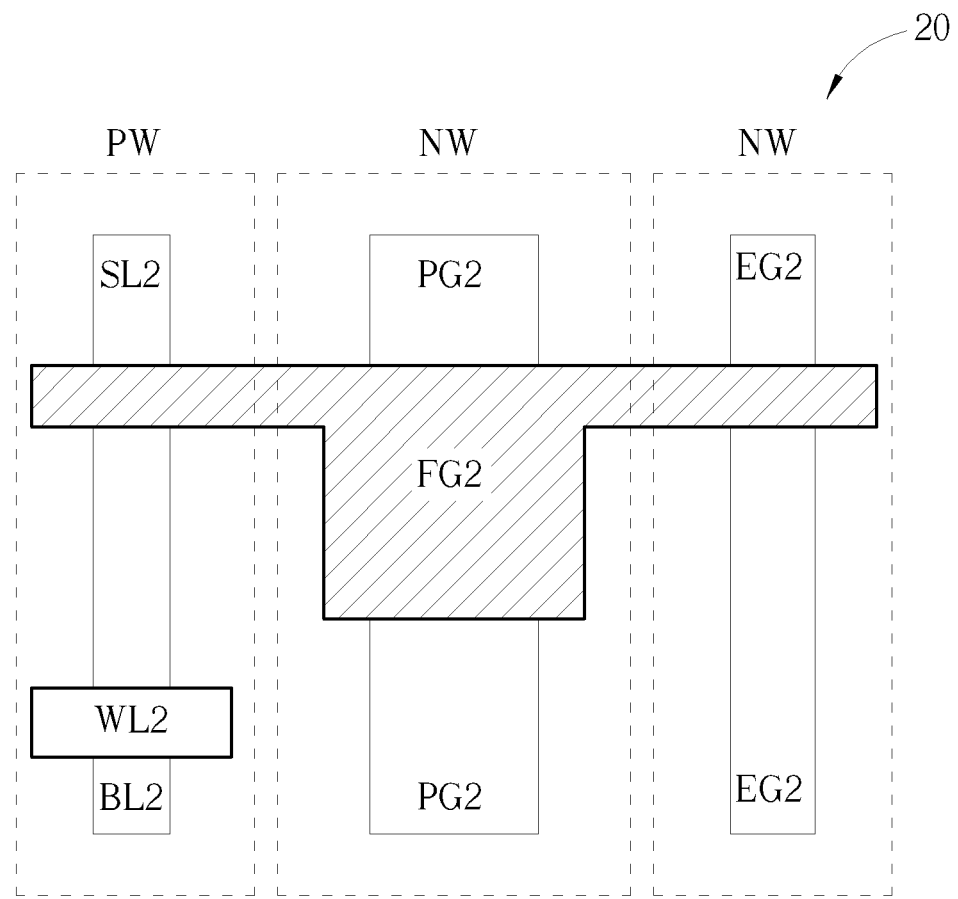
FIG. 2A is a top view of a circuit layout of a non-volatile memory cell according to the prior art.
Figure 2B:
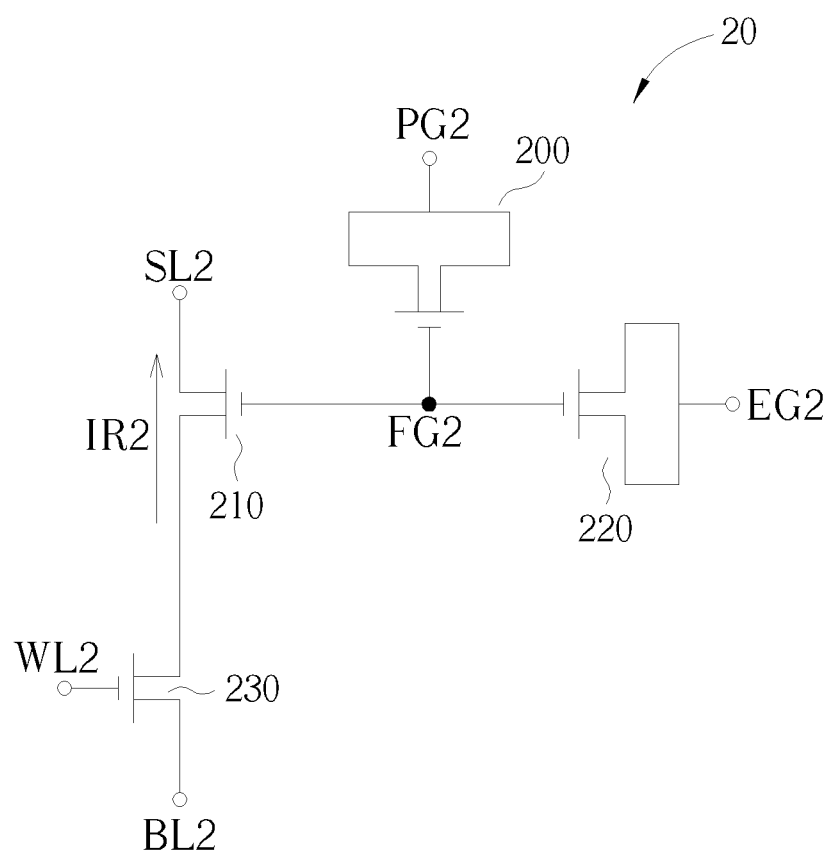
FIG. 2B is a schematic circuit diagram of the non-volatile memory cell shown in FIG. 2A.
Figure 3A:
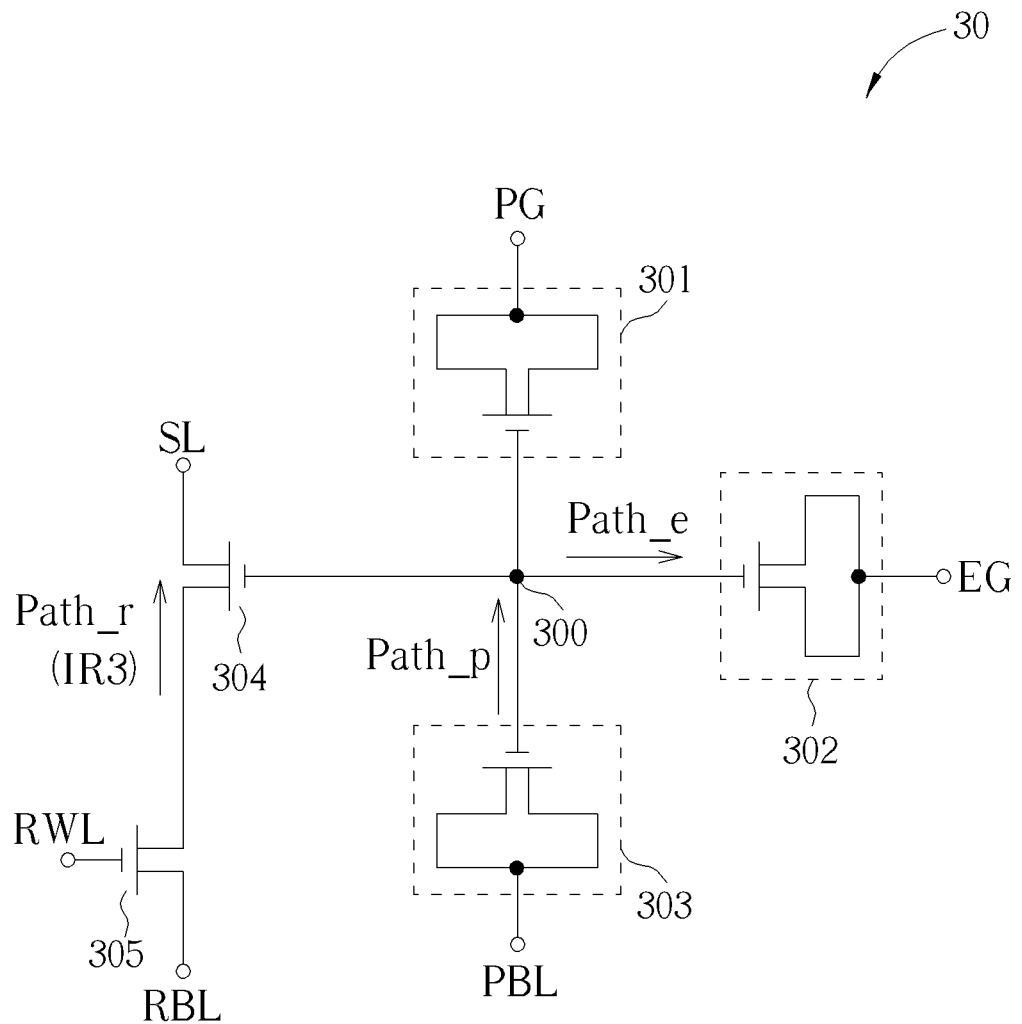
FIG. 3A is a schematic circuit diagram of a non-volatile memory cell according to an embodiment of the present invention.
Figure 3B:
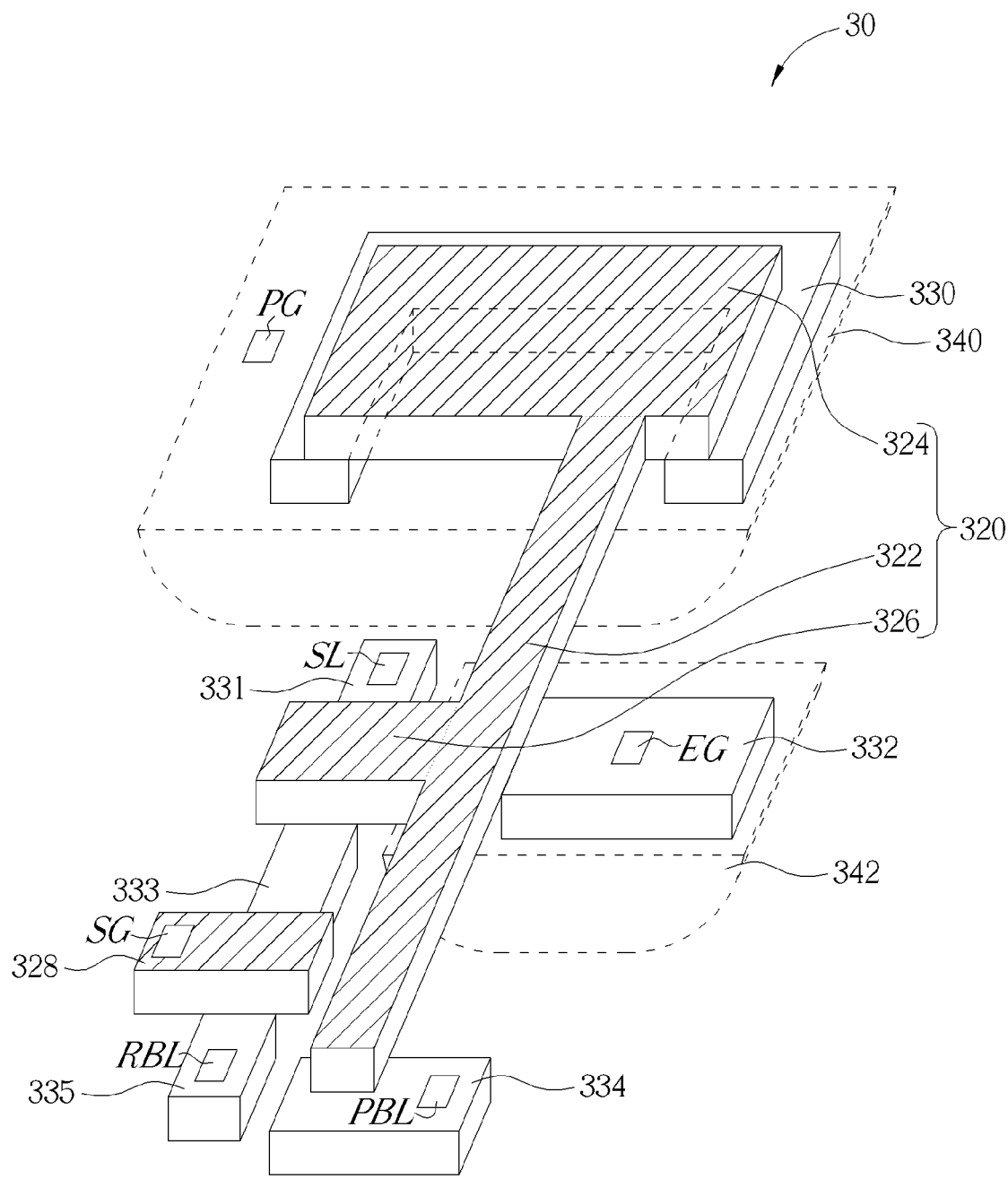
FIG. 3B is a side view of a circuit layout of the non-volatile memory cell shown in FIG. 3A.
Figure 3C:
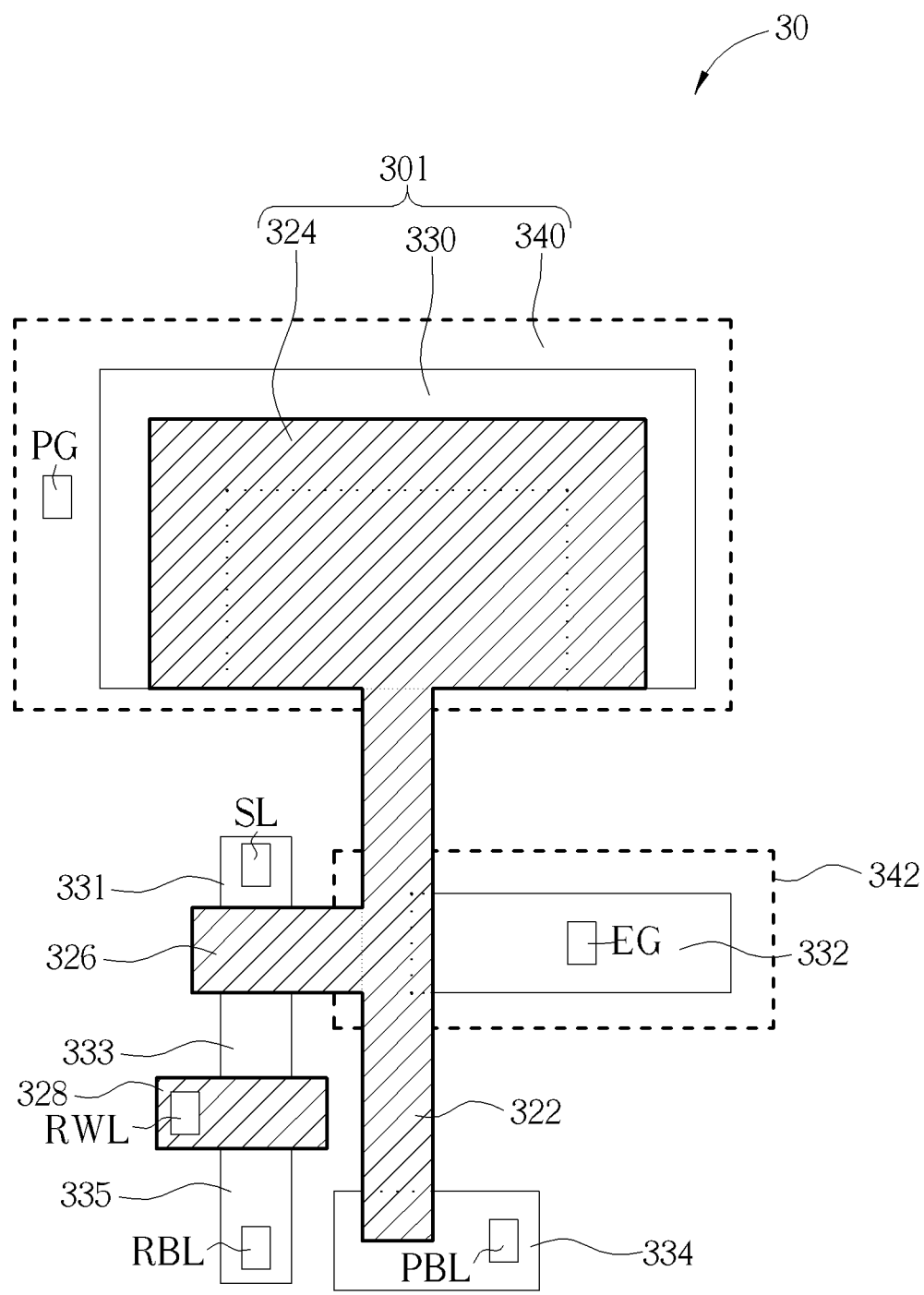
FIG. 3C is a top view of the circuit layout of the non-volatile memory cell shown in FIG. 3A.

FIG. 3A-3C are a schematic circuit diagrams and a side view and a top view of a non-volatile memory cell 30 respectively according to an embodiment of the present invention. As shown in FIG. 3A, the non-volatile memory cell 30 comprises a charge storage node 300, a coupling device 301, an erase tunneling structure 302, a program tunneling structure 303, a read transistor 304 and a select transistor 305. The coupling device 301, the erase tunneling structure 302, the program tunneling structure 303 and the read transistor 304 are coupled to the charge storage node 300. The read transistor 304 and the select transistor 305 are connected in series, and form a read path Path_r. The charge storage node 300 is configured for storing charges to maintain a logical status of the non-volatile memory cell 30. In detail, since a voltage of the charge storage node 300 changes according to the electron ejection and injection. When the non-volatile memory cell 30 operates in an erase mode, the erase tunneling structure 302 forms a tunneling ejection path Path_e, and ejects the electrons from the charge storage node 300. When the non-volatile memory cell 30 operates in a program mode, the program tunneling structure 303 forms a tunneling injection path Path_p to inject the electrons into the charge storage node 300. Thus, when the non-volatile memory cell 30 operates in a read mode, since the voltage of the charge storage node 300 is related to a read current IR3 along the read path Path_r, a logic status of the charge storage node 300 is determined according to the read current IR3 flowing through the read transistor 304.

Specifically, the non-volatile memory cell 30 is fabricated by a logic-based CMOS process, and a circuit layout of the non-volatile memory cell 30 is illustrated in FIGS. 3B and 3C. AS shown in FIGS. 3B and 3C, the non-volatile memory cell 30 comprises a floating gate 320, a select gate 328, active regions 330-335 and wells 340, 342. The floating gate 320, the select gate 328 are formed by the insulation layer and the conductive layer in CMOS process. The conductive layer may be made of conductive material such as metal or polysilicon. The insulation layer may be made of insulation material such as silicon dioxide. The active regions 330-335 may be N+ active regions. The wells 340, 342 may be N wells. The floating gate 320 corresponds to the charge storage node 300 in FIG. 3A, which may be partitioned as a tunneling part 322, a coupling part 324 and a read gate 326. The coupling part 324 is disposed on a conductive region formed by the active region 330 and the well 340 to form the coupling device 301 shown in FIG. 3A. The active region 332 is disposed under a first edge of the tunneling part 322 and partially overlaps with a projection result of the tunneling part 322 to form the erase tunneling structure 302 shown in FIG. 3A. The active region 334 is disposed under a second edge of the tunneling part 322 and partially overlaps with a projection result of the tunneling part 322 to form the program tunneling structure 303 shown in FIG. 3A. The read gate 326 and the active regions 331, 333 form the read transistor 304 shown in FIG. 3A; the select gate 328 and the active regions 333, 335 form the select transistor 305 shown in FIG. 3A. Moreover, the active region 330 may surround the coupling part 324 to couple the coupling part 324 to a specific voltage. In addition, the active region 330 may be implanted in the well 342 to prevent junction breakdown and enhance a voltage withstand of the erase tunneling structure 302.

The non-volatile memory cell 30 may perform a program/erase/read operation through proper bias voltages. Specifically, the conductive region formed by the active region 330 and the well 340 are configured to receive a program voltage PG, the active region 332 is configured to receive an erase voltage EG, the active region 334 is configured to receive a program bit line voltage PBL, the active region 331 is configured to receive a source line voltage SL, the active region 335 is configured to receive a read bit line voltage RBL, and the select gate 328 is configured to receive a read word line voltage RWL. In the erase mode, the select transistor 305 is off, the erase voltage EG is at a high voltage, and the program voltage PG and the program bit line voltage PBL are at a low voltage. A voltage difference between the high voltage and the low voltage is sufficient to produce the tunnel effect. Therefore, a voltage difference between the active region 332 and the tunneling part 322 is sufficient for the erase tunneling structure 302 to produce the electron tunneling ejection to perform the erase operation. In the program mode, the select transistor 305 is off, the program voltage PG and the erase voltage EG are at the high voltage, and the program bit line voltage PBL is at the low voltage. Thus, a voltage difference between the tunneling part 322 and the active region 334 is sufficient for the program tunneling structure 303 to produce the tunneling injection to perform the program operation. In the read mode, the select transistor 305 is conducted and the erase voltage EG, the source line voltage SL and the program bit line voltage PBL are at the low voltage. The read current IR3, depending on the voltage of the read gate 326 (i.e., the voltage of the charge storage node 300), flows through the read path Path_r from the select transistor 305 to the read transistor 304. Therefore, the logic status of the charge storage node 300 is determined according to the read current IR3. Moreover, the high voltage and the low voltage may be adjusted according to system requirements. For example, the high voltage may be 10V, and the low voltage may be 0V, which may produce the tunneling ejection in the erase mode and the tunnel injection in the program mode.

Furthermore, when the non-volatile memory cell 30 operates in a program inhibit mode, the program bit line voltage PBL may be at a first middle voltage. The first middle voltage is for reducing the voltage difference of the tunneling part 322 and the active region 334 such that the program tunneling structure 303 is not able to produce the tunneling injection, which achieves an effect of program inhibit. In addition, in the program mode or the program inhibit mode, the source line voltage SL is at a second middle voltage to prevent the read transistor 304 from inducing unnecessary tunneling effect in the program mode. The first middle voltage and the second middle voltage may be, for example, 5V or 4V, and not limited herein. As long as the middle voltages prevent the unnecessary tunneling effect, the requirements of the present invention are satisfied. In addition, in the read mode, the program voltage PG may be a specific voltage. The specific voltage corresponds to a reference current. The logic status of the charge storage node 300 may be determined by comparing the reference current and the read current IR3, so as to enhance the read performance of the non-volatile memory cell 30.

As can be seen from the above, the read path Path_r of the non-volatile memory cell 30 in the read mode is different from the tunneling ejection path Path_e in the erase mode and the tunneling injection path Path_p in the program mode. In other words, the tunneling ejection path Path_e in the erase mode and the tunneling injection path Path_p in the program mode would not pass through the read transistor 304. Thus, no charge trapping effect in the read transistor 304 is caused due to the tunneling effect. After the program/erase operation is performed many times, a threshold voltage of the read transistor 304 sustains as a stable value. The read performance of the non-volatile memory cell 30 would not be affected by repeated read/program operations, such that an endurance of the non-volatile memory cell 30 is enhanced.

Notably, in the prior art, the non-volatile memory cells utilize transistors to produce tunneling effect. For example, the non-volatile memory cell 10 and the non-volatile memory cell 20 utilize the erase transistor 120 and the erase transistor 220, respectively, to produce electron ejection. The floating gate FG1 and the floating gate FG2 need to extend to form the gates of the erase transistor 120 and the erase transistor 220 such that a couple ratio of the non-volatile memory cell is formed. The couple ratio is related to the voltage level which the floating gate FG1 and the floating gate FG2 are able to be coupled by the coupling device. The lower the couple ratio, the lower the voltage level at which the floating gate FG1 and the floating gate FG2 are able to be coupled, which might affect the tunneling injection and further reduce the program performance of the non-volatile memory cells. In addition, utilizing MOS transistors to produce tunneling effect requires more circuit layout area. In fact, producing the tunneling effect does not require an entire MOS transistor. As long as an active region is disposed under an edge of the insulation layer in the circuit layout and sufficient bias voltages are applied, the tunneling effect is produced. Thus, the couple ratio is increased and the circuit area is reduced. In other words, the present invention utilizes the erase tunneling structure 302 and the program tunneling structure 303 to produce the tunneling effect, such that the circuit area of the non-volatile memory cell 30 is reduced, the couple ratio of the non-volatile memory cell 30 is increased, and the program performance is enhanced.

Figure 4:
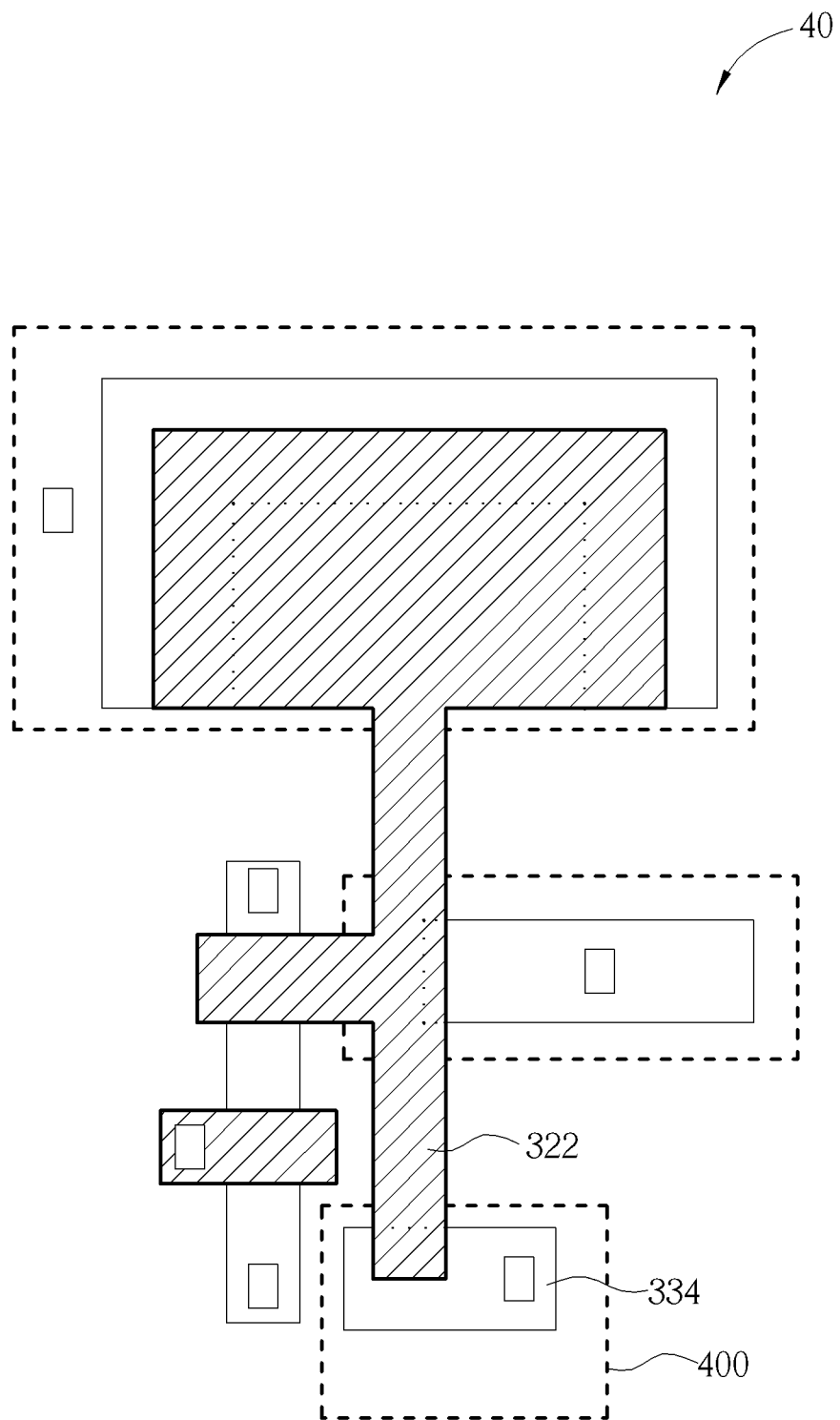
FIG. 4 is a top view of a circuit layout of a non-volatile memory cell according to an embodiment of the present invention.

Notably, the embodiments stated above are utilized for illustrating concepts of the present invention. Those skilled in the art may make modifications and alternations accordingly, and not limited herein. For example, FIG. 4 is a top view of a circuit layout of a non-volatile memory cell 40 according to an embodiment of the present invention. The non-volatile memory cell 40 is similar to the non-volatile memory cell 30, and thus, the same components are denoted by the same symbols. Different from the non-volatile memory cell 30, the non-volatile memory cell 40 further comprises a well 400, disposed under the active region 334. The well 400 may be an N well, configured to prevent junction breakdown and enhance a voltage withstand between the active region 334 and the tunneling part 322. The non-volatile memory cell 40 also satisfies the requirements of the present invention.

Figure 5A:
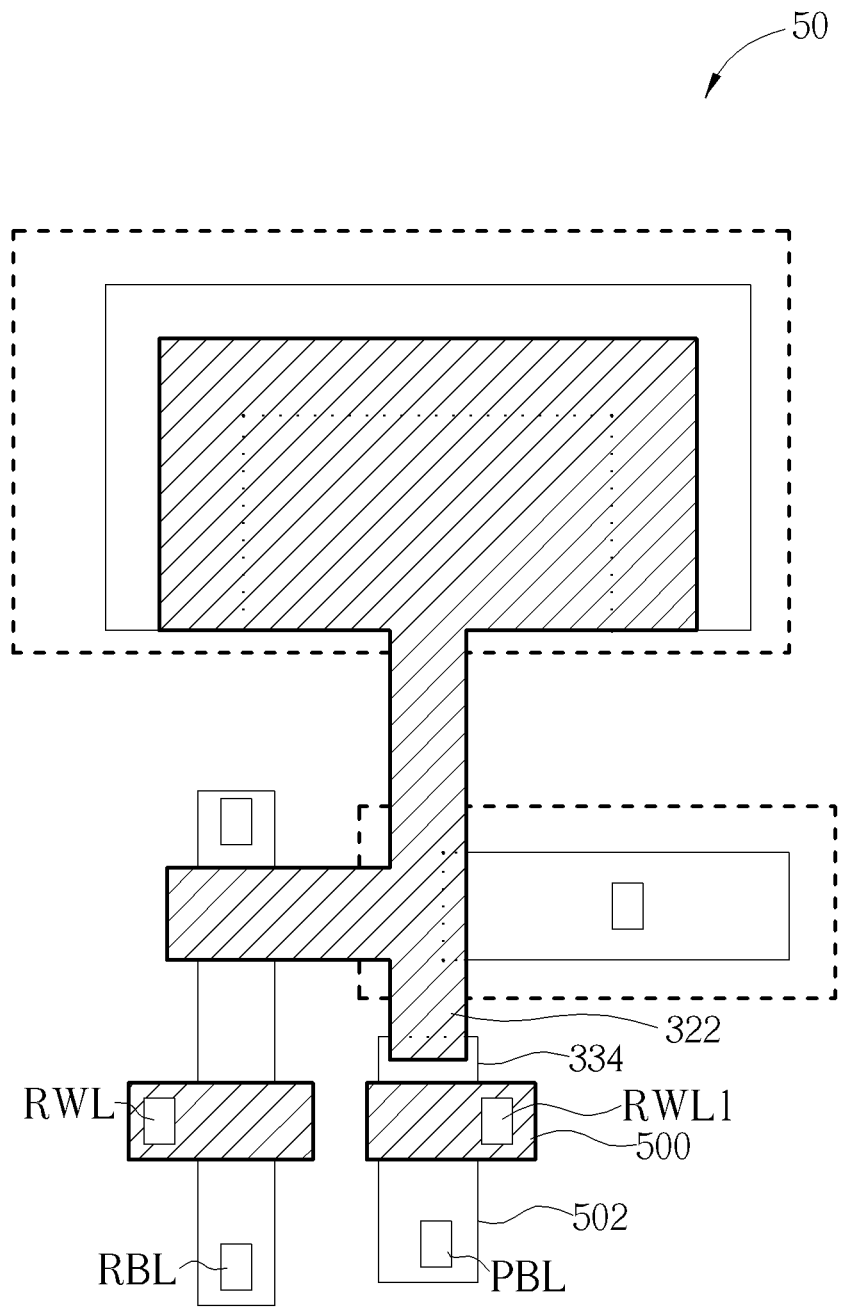
FIG. 5A is a top view of a circuit layout of a non-volatile memory cell according to an embodiment of the present invention.
Figure 5B:
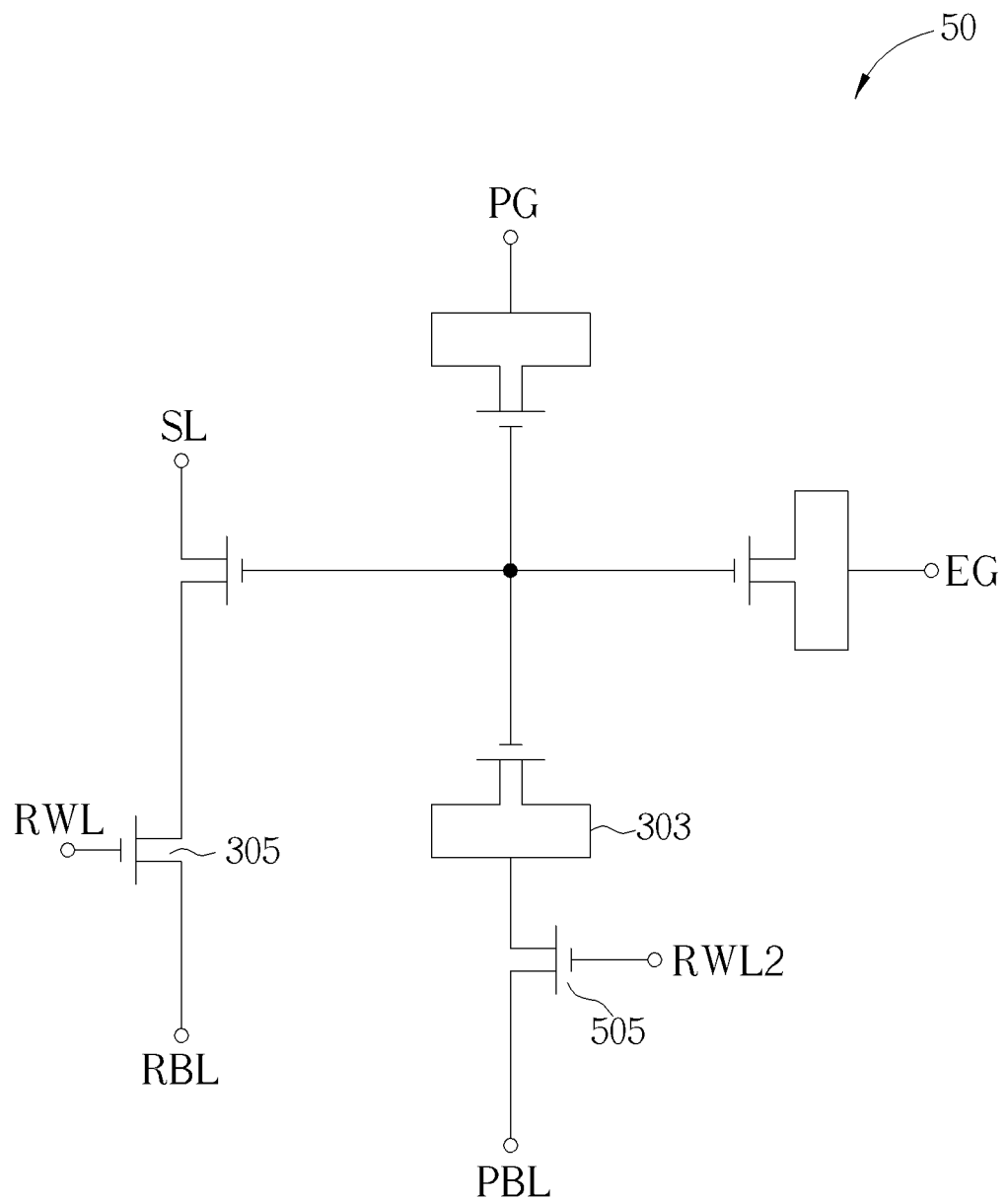
FIG. 5B is a schematic circuit diagram of the non-volatile memory cell shown in FIG. 5A.
Figure 6A:
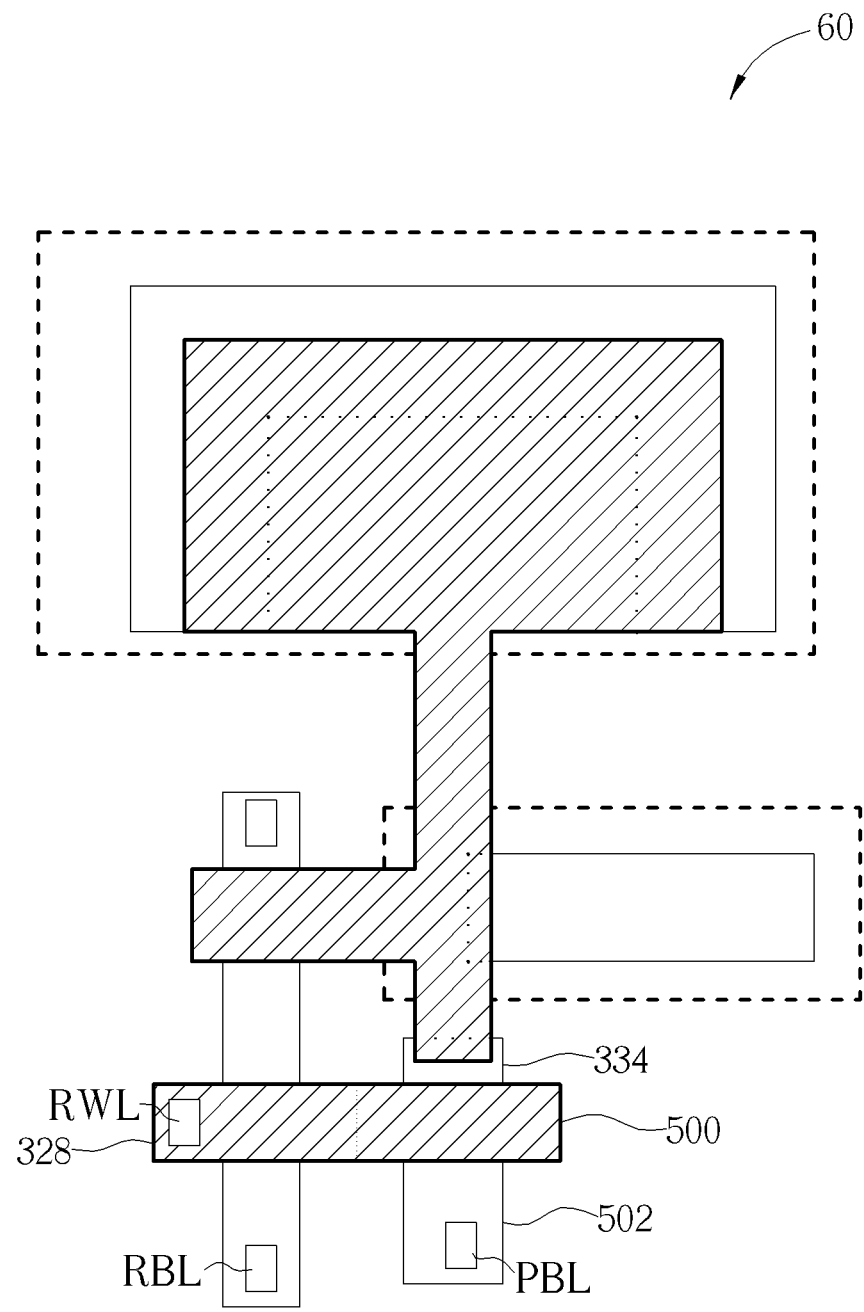
FIG. 6A is a top view of a circuit layout of a non-volatile memory cell according to an embodiment of the present invention.
Figure 6B:
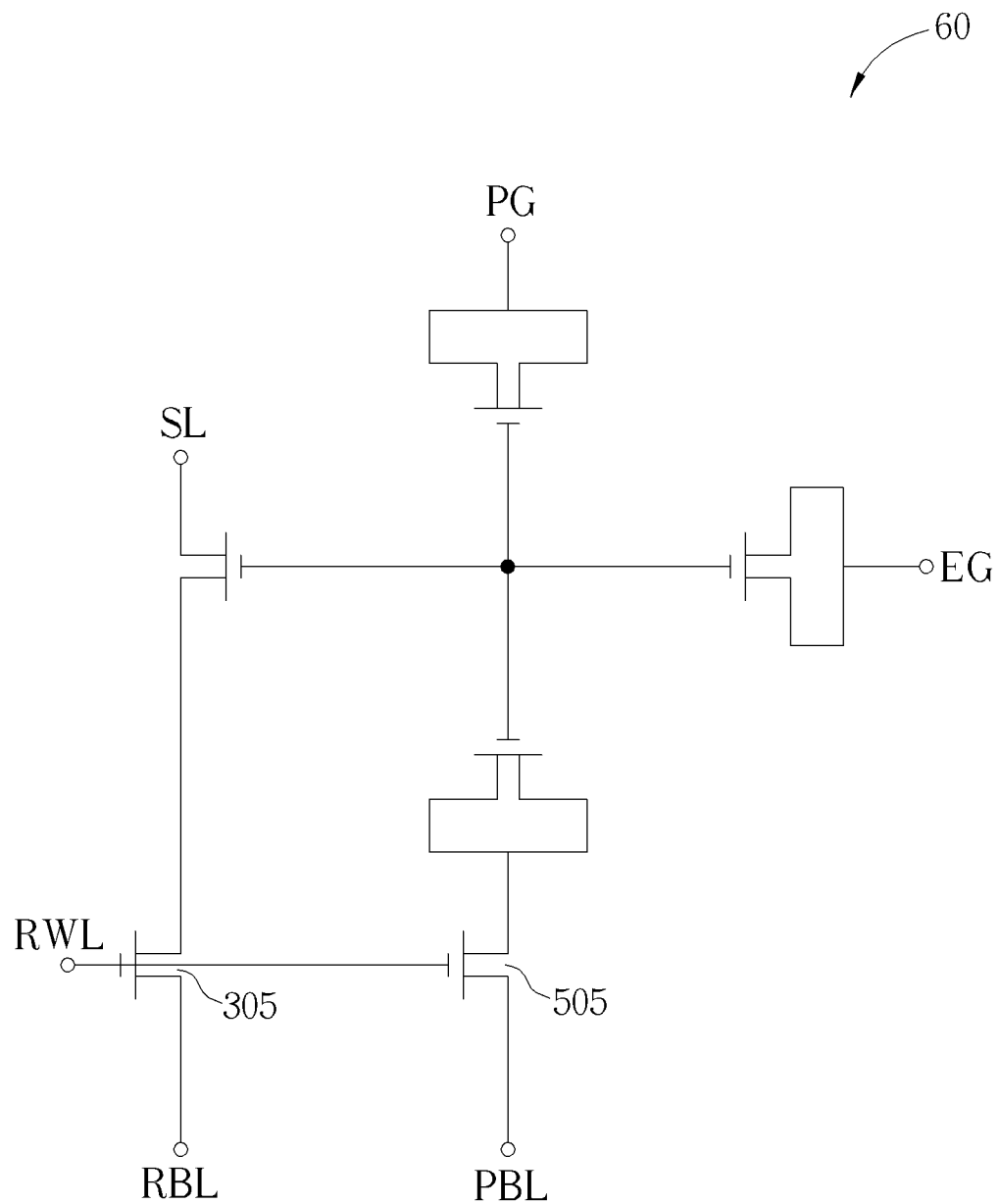
FIG. 6B is a schematic circuit diagram of the non-volatile memory cell shown in FIG. 6A.

Furthermore, FIG. 5A is a top view of a circuit layout of a non-volatile memory cell 50 according to an embodiment of the present invention, and FIG. 5B is a schematic circuit diagram of the non-volatile memory cell 50. The non-volatile memory cell 50 is similar to the non-volatile memory cell 30, and thus, the same components are denoted by the same symbols. Different from the non-volatile memory cell 30, the program tunneling structure 303 of the non-volatile memory cell 50 is further coupled to a select transistor 505. In other words, the non-volatile memory cell 50 further comprises a select gate 500 and an active region 502. The select gate 500 is disposed over an edge of the active region 334. The active region 502 is disposed under an edge of the select gate 500. In other words, the active region 334, the select gate 500 and the active region 502 form the select transistor 505. The select gate 500 is configured to receive a read word line voltage RWL1, and the active region 334 is configured to receive the program bit line voltage PBL. Therefore, the read word line voltage RWL1 is configured to optionally control whether the non-volatile memory cell 50 performs program operations to avoid the non-volatile memory cell 50 from being disturbed by programming of other non-volatile memory cells on the same bit lines, such that the program performance is enhanced. In addition, the select gate 500 and the select gate 328 can be integrated as a single gate. For example, FIG. 6A is a top view of a circuit layout of a non-volatile memory cell 60 according to an embodiment of the present invention, and FIG. 6B is a schematic circuit diagram of the non-volatile memory cell 60. The non-volatile memory cell 60 is similar to the non-volatile memory cell 50, and thus, the same components are denoted by the same symbols. Different from the non-volatile memory cell 50, the select gate 500 and the select gate 328 are integratedly connected, and configured to receive the read word line voltage RWL to avoid the non-volatile memory cell 50 from being disturbed by programming of other non-volatile memory cells on the same bit lines, such that the program performance is enhanced.

In summary, the non-volatile memory cell in the prior art utilizes the read transistor to produce the tunneling effect. After the erase operation and program operation are performed many times, the read performance of the non-volatile memory cell degrades due to the degradation of the read transistor. In comparison, the non-volatile memory cell in the present invention utilizes the erase tunneling structure and the program tunneling structure to form the tunneling ejection path and the tunneling injection path to perform the erase operation and the program operation of the non-volatile memory cell. Since the tunneling ejection path and the tunneling injection path are different from the read path in the read operation, after the erase operation and program operation are performed many times, the read performance of the non-volatile memory cell of the present invention would not be affected by the erase operations and program operations. In another perspective, since the non-volatile memory cell of the present invention only utilizes the tunneling structure to produce tunneling effect, instead of an entire MOS transistor, the circuit layout area of the non-volatile memory cell is effectively reduced and the couple ratio of the non-volatile memory cell is enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory cell, comprising:
   a tunneling part;
   a coupling device, comprising a coupling part and a conductive region, the coupling part coupled to the tunneling part and disposed on the conductive region;
   a read transistor, comprising a read gate coupled to the tunneling part;
   a first select transistor, connected to the read transistor in series, configured for forming a read path with the read transistor when the non-volatile memory cell operates in a read mode;
   an erase tunneling structure, configured for forming a tunneling ejection path when the non-volatile memory cell operates in an erase mode, the erase tunneling structure comprising an erase active region disposed under a first edge of the tunneling part and partially overlapping with a projection result of the tunneling part; and
   a program tunneling structure, forming a tunneling injection path when the non-volatile memory cell operates in a program mode, the program tunneling structure comprising a program active region disposed under a second edge of the tunneling part and partially overlapping with the projection result of the tunneling part;
   wherein the read path is different from the tunneling ejection path and the tunneling injection path.

2. The non-volatile memory cell of claim 1, wherein the erase tunneling structure further comprises an erase well disposed under the erase active region.

3. The non-volatile memory cell of claim 1, wherein the program tunneling structure further comprises a program well disposed under the program active region.

4. The non-volatile memory cell of claim 1, wherein the conductive region comprises a first well and a first active region, and the first active region is disposed in the first well.

5. The non-volatile memory cell of claim 4, wherein the first active region surrounds the coupling part.

6. The non-volatile memory cell of claim 1, wherein a second active region is disposed between the read gate of the read transistor and a first select gate of the first select transistor, and the read transistor and the first select transistor are connected in series through the second active region.

7. The non-volatile memory cell of claim 6, wherein the conductive region is configured to receive a first voltage, the erase active region is configured to receive an erase voltage, the program active region is configured to receive a program bit line voltage, a first terminal different from the second active region of the read transistor is configured to receive a source line voltage, a second terminal different from the second active region of the first select transistor is configured to receive a read bit line voltage, and the first select gate is configured to receive a read word line voltage.

8. The non-volatile memory cell of claim 7, wherein when the non-volatile memory cell operates in the erase mode, the erase voltage is at a high voltage, and the first voltage and the program bit line voltage are at a low voltage, such that the erase tunneling structure produces electron tunneling ejection.

9. The non-volatile memory cell of claim 7, wherein when the non-volatile memory cell operates in the program mode, the first voltage and the erase voltage are at a high voltage, and the program bit line voltage are at a low voltage, such that the program tunneling structure produces electron tunneling injection.

10. The non-volatile memory cell of claim 9, wherein when the non-volatile memory cell operates in a program inhibit mode, the program bit line voltage are at a first middle voltage, and the first middle voltage inhibits the program tunneling structure producing electron tunneling injection.

11. The non-volatile memory cell of claim 10, wherein when the non-volatile memory cell operates in the program mode or the program inhibit mode, the source line voltage is at a second middle voltage, and the second middle voltage inhibits the read transistor producing electron tunneling injection.

12. The non-volatile memory cell of claim 7, wherein when the non-volatile memory cell operates in the read mode, the first select transistor is conducted, and the erase voltage, the source line voltage and the program bit line voltage are at a low voltage.

13. The non-volatile memory cell of claim 12, wherein when the non-volatile memory cell operates in the read mode, the first voltage is a specific bias voltage.

14. The non-volatile memory cell of claim 6, further comprising:
   a second select gate, disposed over a third edge of the program active region, a projection result of the second select gate is adjacent to the program active region; and
   a third active region, disposed under a fourth edge of the second select gate and adjacent to the projection result of the second select gate;
   wherein the program active region, the second select gate and the third active region form a second select transistor.

15. The non-volatile memory cell of claim 14, wherein the first select gate and the second select gate are integratedly connected.

16. The non-volatile memory cell of claim 14, wherein the first select gate and the second select gate are disconnected.

17. The non-volatile memory cell of claim 1, wherein the coupling part, the read gate and the tunneling part are integratedly connected and form a floating gate.

* * * * *